United States Patent
Zhu et al.

(10) Patent No.: US 10,373,557 B2
(45) Date of Patent: Aug. 6, 2019

(54) ORGANIC LIGHT-EMITTING PIXEL DRIVING CIRCUIT, DRIVING METHOD AND ORGANIC LIGHT-EMITTING DISPLAY PANEL

(71) Applicant: SHANGHAI TIANMA AM-OLED CO., LTD., Shanghai (CN)

(72) Inventors: Renyuan Zhu, Shanghai (CN); Yue Li, Shanghai (CN); Tong Wu, Shanghai (CN); Dongxu Xiang, Shanghai (CN); Zeyuan Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 37 days.

(21) Appl. No.: 15/636,455

(22) Filed: Jun. 28, 2017

(65) Prior Publication Data

US 2017/0301293 A1    Oct. 19, 2017

(30) Foreign Application Priority Data

Jan. 25, 2017    (CN) .......................... 2017 1 0056019

(51) Int. Cl.
*G09G 3/3233*    (2016.01)
*H01L 27/32*    (2006.01)
(Continued)

(52) U.S. Cl.
CPC ......... *G09G 3/3233* (2013.01); *G09G 3/3208* (2013.01); *G09G 3/3258* (2013.01);
(Continued)

(58) Field of Classification Search
CPC ......... G09G 2300/0819; G09G 3/3258; G09G 3/3208; G09G 3/3233; G09G 3/3225;
(Continued)

(56) References Cited

U.S. PATENT DOCUMENTS 9,786,222 B2 * 10/2017 Lim ..................... G09G 3/3233
9,786,224 B2 * 10/2017 Kim ..................... G09G 3/2011
(Continued)

FOREIGN PATENT DOCUMENTS

CN    104464616 A    3/2015
CN    104485071 A    4/2015
(Continued)

OTHER PUBLICATIONS

Chinese, 1st Office Action dated Jun. 29, 2018.

*Primary Examiner* — Dismery Mercedes
(74) *Attorney, Agent, or Firm* — Alston & Bird LLP

(57) ABSTRACT

The present application discloses an organic light-emitting pixel driving circuit, a driving method and an organic light-emitting display panel. The organic light-emitting pixel driving circuit comprises: a first transistor provides an initialization signal to an anode of the organic light-emitting diode and a gate of the driving transistor; a second transistor compensates a threshold voltage of the driving transistor; a third transistor provides a data signal to the driving transistor; a fourth transistor transmits a first power supply voltage to the driving transistor; a fifth transistor controls electrical connection between the driving transistor and the organic light-emitting diode based on a signal of the second light-emission controlling signal terminal; a capacitor is used to store the data signal transmitted to the driving transistor; an organic light-emitting diode is used to emit light in response to the driving current generated by the driving transistor.

16 Claims, 7 Drawing Sheets

(51) Int. Cl.
*G09G 3/3275* (2016.01)
*G09G 3/3266* (2016.01)
*G09G 3/3208* (2016.01)
*G09G 3/3258* (2016.01)
*H01L 29/786* (2006.01)
*H01L 27/12* (2006.01)
*G09G 3/3291* (2016.01)

(52) U.S. Cl.
CPC ......... *G09G 3/3266* (2013.01); *G09G 3/3275* (2013.01); *H01L 27/3248* (2013.01); *G09G 3/3291* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2310/0286* (2013.01); *G09G 2320/0233* (2013.01); *G09G 2320/043* (2013.01); *G09G 2320/0626* (2013.01); *G09G 2330/02* (2013.01); *H01L 27/1251* (2013.01); *H01L 27/3262* (2013.01); *H01L 29/78645* (2013.01); *H01L 29/78696* (2013.01); *H01L 2227/32* (2013.01)

(58) Field of Classification Search
CPC ............... G09G 3/3291; G09G 3/3266; G09G 2300/0852; G09G 2300/0861; G09G 2300/043; G09G 2310/0251; G09G 2320/0242; G09G 2320/0233; G09G 2320/0295; G09G 2360/16; G09G 2320/043; G09G 2310/0262; G09G 2310/0264; G09G 2300/0842; G09G 2300/0426; H01L 27/3262; H01L 27/3265; H01L 27/3248; H01L 2227/323; H01L 29/78645; H01L 27/3244; H01L 27/1251; H01L 27/3276; H01L 2227/32; H01L 51/5296
See application file for complete search history.

(56) References Cited

U.S. PATENT DOCUMENTS

| | | | | |
|---|---|---|---|---|
| 9,922,599 | B2* | 3/2018 | Li | G09G 3/3291 |
| 10,056,038 | B2* | 8/2018 | Xiang | G09G 3/3258 |
| 2006/0027807 | A1* | 2/2006 | Nathan | G09G 3/3233 |
| | | | | 257/59 |
| 2015/0356924 | A1* | 12/2015 | Chen | G09G 3/3233 |
| | | | | 345/690 |
| 2016/0133190 | A1* | 5/2016 | Kim | G09G 3/2011 |
| | | | | 345/80 |
| 2016/0217739 | A1* | 7/2016 | Kang | G09G 3/3233 |
| 2017/0061875 | A1* | 3/2017 | Cho | G09G 3/3233 |
| 2017/0110056 | A1* | 4/2017 | Hu | G09G 3/3258 |
| 2017/0116918 | A1* | 4/2017 | Dong | G09G 3/3233 |
| 2017/0270860 | A1* | 9/2017 | Wang | G09G 3/3233 |
| 2017/0301295 | A1* | 10/2017 | Park | G09G 3/3258 |
| 2018/0005576 | A1* | 1/2018 | Yoon | G09G 3/3233 |
| 2018/0114487 | A1* | 4/2018 | He | G09G 3/3258 |

FOREIGN PATENT DOCUMENTS

| | | |
|---|---|---|
| CN | 106023895 A | 10/2016 |
| CN | 106205493 A | 12/2016 |

* cited by examiner

ORGANIC LIGHT-EMITTING PIXEL DRIVING CIRCUIT, DRIVING METHOD AND ORGANIC LIGHT-EMITTING DISPLAY PANEL

CROSS-REFERENCE TO RELATED APPLICATION

This application is related to and claims priority from Chinese Patent Application No. CN201710056019.1, filed on Jan. 25, 2017, entitled "Organic Light-Emitting Pixel Driving Circuit, Driving Method and Organic Light-Emitting Display Panel," the entire disclosure of which is hereby incorporated by reference for all purposes.

TECHNICAL FIELD

The present application relates to the technical field of display, and particularly to an organic light-emitting pixel driving circuit, a driving method and an organic light-emitting display panel.

BACKGROUND

An Organic Light-emitting Diode (OLED) is a device made of an organic semiconductor material, and used to implement a display using reversible color change generated under the drive of an electrical current. It is extensively used in various electronic apparatuses for having advantages such as lower energy consumption, high contrast, broad view angle and self-light emission.

Since the organic light-emitting diode emits light driven by an electrical current generated by a thin film transistor in a saturated state, and its luminance is directly proportional to the electrical current flowing through. Caused by limitations in manufacturing processes, particularly driving transistors manufactured using low-temperature polycrystalline silicon technology tend to exhibit non-uniform distribution of threshold voltages Vth, resulting in different driving currents being generated when the same gray-scale voltage is inputted. This makes the luminance of the organic light-emitting display panel uneven, which affects the display effect.

SUMMARY

It is desired to provide a pixel driving circuit and display device so as to solve the technical problem mentioned above.

In a first aspect, embodiments of the present application provide an organic light-emitting pixel driving circuit, comprising: a first scanning signal terminal, a second scanning signal terminal, a first light-emission controlling signal terminal, a second light-emission controlling signal terminal, a first transistor, a second transistor, a third transistor, a fourth transistor, a fifth transistor, a diving transistor, an organic light-emitting diode and a capacitor; wherein, the first transistor provides an initialization signal to an anode of the organic light-emitting diode and a gate of the driving transistor based on a signal of the first scanning signal terminal; the second transistor compensates a threshold voltage of the driving transistor based on a signal of the second scanning signal terminal; the third transistor provides a data signal to the driving transistor based on a signal of the second scanning signal terminal; the fourth transistor transmits a first power supply voltage to the driving transistor based on a signal of the first light-emission controlling signal terminal; the fifth transistor is coupled in series between the driving transistor and the anode of the organic light-emitting diode, and controls electrical connection between the driving transistor and the organic light-emitting diode based on a signal of the second light-emission controlling signal terminal; the capacitor is used to store a data signal transmitted to the driving transistor; the organic light-emitting diode is used to emit light in response to the driving current generated by the driving transistor.

In a second aspect, embodiments of the present application provide a method of driving the above-mentioned organic light-emitting pixel driving circuit, the driving method comprising an initialization phase, a threshold detection and data write phase, and a light-emitting phase; in the initialization phase, the first transistor transmits an initialization voltage to an anode of the organic light-emitting diode and a gate of the driving transistor based on a signal of the first scanning signal terminal, and the organic light-emitting diode and driving transistor complete initialization; in the threshold detection and data write phase, the data signal terminal receives the data signal, the third transistor transmits the data signal to the gate of the driving transistor based on the signal on the second scanning signal terminal, the pixel driving circuit completes data write and completes threshold detection of the driving transistor; in the light-emitting phase, the first transistor is turned off based on the signal of the first scanning signal terminal, the second transistor and third transistor are turned off based on the signal of the second scanning signal terminal, the fourth transistor transmits the first power supply voltage signal to the driving transistor based on the signal of the first light-emission controlling signal terminal, the driving transistor generates a driving current, the fifth transistor is turned on based on the signal of the second light-emission controlling signal terminal, and the organic light-emitting diode emits light based on the driving current.

In a third aspect, embodiments of the present application provide an organic light-emitting display panel comprising multiple rows of pixel units, each row of pixel units comprising a plurality of the organic light-emitting pixel driving circuits.

According to the organic light-emitting pixel driving circuit and the organic light-emitting display panel according to the present application, the signal received by the first scanning signal terminal implements initialization of the organic light-emitting pixel driving circuit by controlling the first transistor to transmit the initialization signal to the anode of the organic light-emitting diode and the gate of the driving transistor, and implements compensation for the threshold by controlling the second transistor and third transistor through the signal of the second scanning signal terminal, and improves uniformity and stability of display of the organic light-emitting display panel.

In the organic light-emitting pixel circuit according to some embodiments of the present application, the initialization signal is provided by the signal received by the first scanning signal terminal, and an area of layout occupied by the organic light-emitting pixel driving circuit is saved.

In the organic light-emitting display panel according to some embodiments of the present application, the pixel units in adjacent rows share a scanning signal line and light-emission controlling signal line to provide a corresponding signal to each pixel driving circuit, and can further save an area of layout occupied by the organic light-emitting pixel driving circuit.

BRIEF DESCRIPTION OF THE DRAWINGS

Other features, objects, and advantages of the present application will become more apparent upon reading of the following detailed description of the non-limiting embodiments with reference to the accompanying drawings.

DETAILED DESCRIPTION OF EMBODIMENTS

The present application will be further described below in detail in combination with the accompanying drawings and the embodiments. It should be appreciated that the specific embodiments described herein are merely used for explaining the relevant invention, rather than limiting the invention. In addition, it should be noted that, for the ease of description, only the parts related to the relevant invention are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 1:
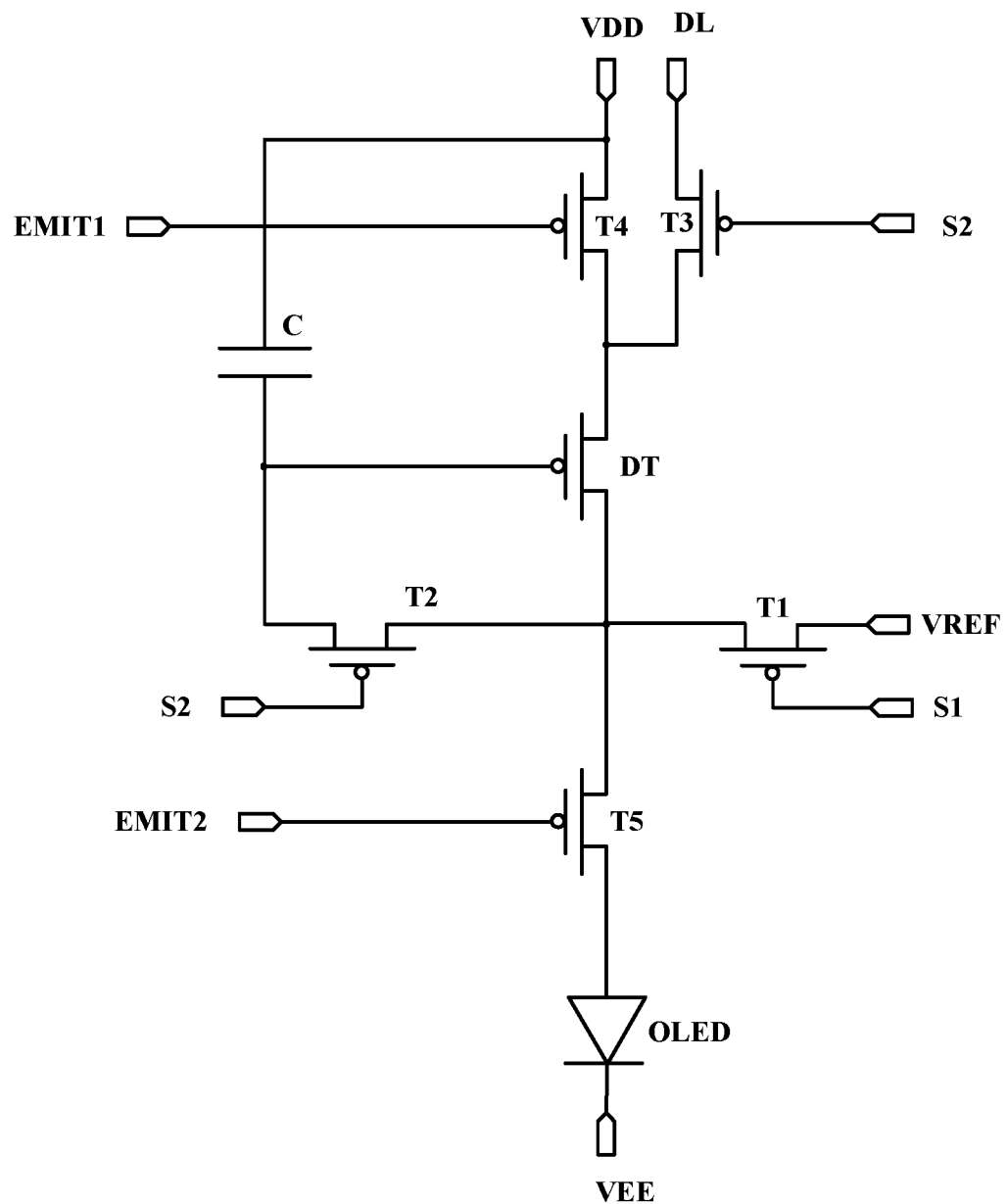
FIG. 1 is a structural schematic view of an embodiment of an organic light-emitting pixel driving circuit according to the present application.

Referring to FIG. 1, it is a structural schematic view of an organic light-emitting pixel driving circuit according to the present application. The organic light-emitting pixel driving circuit shown in FIG. 1 drives an organic light-emitting diode OLED.

As shown in FIG. 1, the organic light-emitting pixel driving circuit comprises a first scanning signal terminal S1, a second scanning signal terminal S2, a first light-emission controlling signal terminal EMIT1, a second light-emission controlling signal terminal EMIT2, a first transistor T1, a second transistor T2, a third transistor T3, a fourth transistor T4, a fifth transistor T5, a diving transistor DT, an organic light-emitting diode OLED and a capacitor C.

In the present embodiment, the first transistor T1 is turned on under the control of the signal received by the first scanning signal terminal S1, the first transistor T1 provides an initialization signal to an anode of the organic light-emitting diode OLED and a gate of the driving transistor DT. The second transistor T2 is turned on under control of a signal received by the second scanning signal terminal S2, the second transistor T2 may compensate for a threshold voltage of the driving transistor DT. When turned on under control of a signal received by the second scanning signal terminal S2, the third transistor T3 may provide a data signal to the driving transistor DT. When turn on under control of a signal received by the first light-emission controlling signal terminal EMIT1, the fourth transistor T4 may transmit a first power supply voltage signal to the driving transistor DT. The fifth transistor T5 is coupled in series between the driving transistor DT and the anode of the organic light-emitting diode OLED, and is turn on or turned off under control of a signal received by the second light-emission controlling signal terminal EMIT2 to control the connection between the driving transistor DT and the anode of the organic light-emitting diode OLED. The capacitor C is used to store the data signal transmitted to the driving transistor DT to maintain light emission and display of the organic light-emitting diode OLED in a frame period. The organic light-emitting diode OLED may receive a driving current generated by the driving transistor DT, and emits light and displays based on the driving current.

In the present embodiment, six transistors, namely, the transistors T1-T5 and the driving transistor DT, and the capacitor C are used to generate the driving current to implement the driving of the organic light-emitting diode OLED. The second transistor T2 and third transistor T3, under control of the signal transmitted by the second scanning signal terminal S2, provide the data signal to the gate of the driving transistor DT. A potential of the gate of the driving transistor DT gradually rises to the data signal minus the threshold voltage of the driving transistor, thereby implementing compensation for the threshold of the driving transistor DT in the interior of the circuit, reducing the number of transistors in the organic light-emitting pixel driving circuit, and saving an area of the layout occupied by the organic light-emitting pixel driving circuit.

Optionally, the first transistor T1 and second transistor T2 may be both dual-gate transistors. With the first transistor T1 and second transistor T2 being provided as dual-gate transistors, meanwhile two gates of the two dual-gate transistors are connected together, leaking current is reduced when the channels of the first transistor T1 and second transistor T2 are pinched off to sufficiently turn off the first and second transistors, thus stability of the circuit is improved.

Optionally, a width-length ratio of the electrically conductive channels of the first transistor T1 and second transistor T2 is smaller than a width-length ratio of electrically conductive channels of the third transistor T3, fourth transistor T4 and fifth transistor T5. As such, leaked current can be reduced when the channels of the first transistor T1 and second transistor T2 are pinched off, and thus stability of the circuit is improved.

In some optional implementation modes of the present embodiment, the organic light-emitting pixel driving circuit 100 may further comprise an initialization signal terminal VREF which is used to provide the initialization signal to the gate of the driving transistor DT and the anode of the organic light-emitting diode OLED.

In some optional implementation modes of the present embodiment, the organic light-emitting pixel driving circuit may further comprise a data signal terminal DL, a first power supply voltage terminal VDD and a second power supply voltage terminal VEE. The data signal terminal DL is used to receive the above data signal, the first power supply voltage terminal VDD is used to receive the first power supply voltage signal, and the second power supply voltage terminal VEE is used to receive a second power supply voltage signal.

A gate of the first transistor T1 is connected with the first scanning signal terminal S1, a first electrode of the first transistor T1 is connected with the initialization signal terminal VREF, and a second electrode of the first transistor T1 is connected with a second electrode of the driving transistor DT.

A gate of the second transistor T2 is connected with the second scanning signal terminal S2, a first electrode of the second transistor T2 is connected with the second electrode of the driving transistor DT, and a second electrode of the second transistor T2 is connected with the gate of the driving transistor DT.

A gate of the third transistor T3 is connected with the second scanning signal terminal S2, a first electrode of the third transistor T3 is connected with the data signal terminal DL, and a second electrode of the third transistor T3 is connected with the first electrode of the driving transistor DT.

A gate of the fourth transistor T4 is connected with the first light-emission controlling signal terminal EMIT1, a first electrode of the fourth transistor T4 is connected with the first power supply voltage terminal VDD, and a second electrode of the fourth transistor T4 is connected with the first electrode of the driving transistor DT.

A gate of the fifth transistor T5 is connected with the second light-emission controlling signal terminal EMIT2, a first electrode of the fifth transistor T5 is connected with the second electrode of the driving transistor DT, and a second electrode of the fifth transistor T5 is connected with the anode of the organic light-emitting diode OLED.

A terminal of the capacitor C is connected to the first power supply voltage terminal VDD, and the other terminal of the capacitor C is connected to the gate of the driving transistor DT.

A cathode of the organic light-emitting diode OLED is connected to the second power supply voltage terminal VEE.

In the present embodiment, the aforesaid initialization signal is a signal transmitted on the initialization signal terminal.

The above structure is used by the organic light-emitting pixel driving circuit. Under control of the signal transmitted by the second scanning signal terminal S2, the second transistor T2 and third transistor T3 provide the data signal to the gate of the driving transistor DT. The potential of the gate of the driving transistor DT gradually rises to the data signal minus the threshold voltage of the driving transistor, thereby implementing compensation for the threshold of the driving transistor DT in the interior of the circuit, reducing the number of transistors in the organic light-emitting pixel driving circuit, and saving an area of the layout occupied by the organic light-emitting pixel driving circuit.

Figure 2:
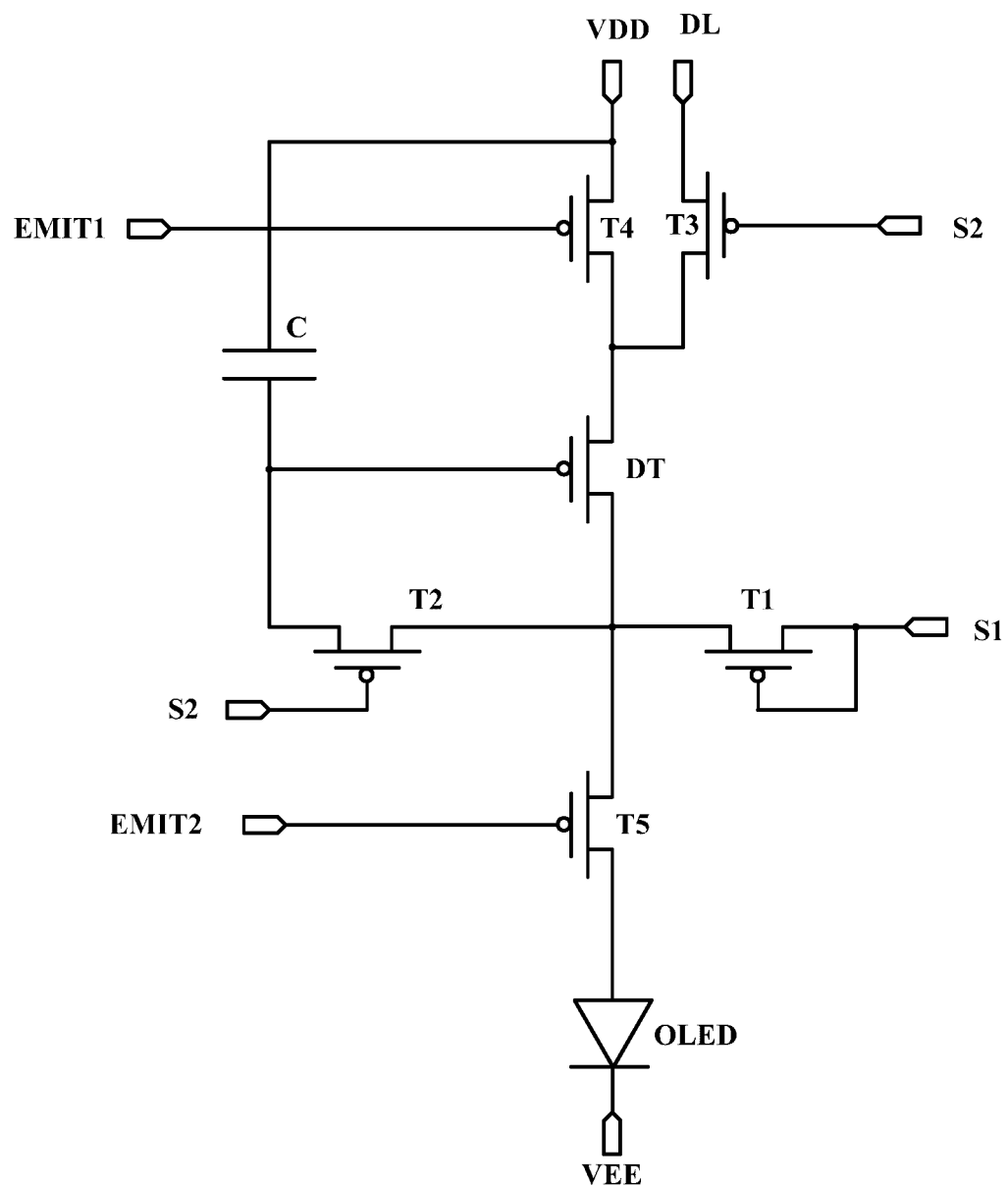
FIG. 2 is a schematic structural diagram of an optional implementation mode of the organic light-emitting pixel driving circuit of the embodiment shown in FIG. 1.

Referring to FIG. 2, FIG. 2 is a schematic structural diagram of an optional implementation mode of the embodiment shown in FIG. 1.

As in FIG. 1, the organic light-emitting pixel driving circuit shown in FIG. 2 also comprises a first scanning signal terminal S1, a second scanning signal terminal S2, a first light-emission controlling signal terminal EMIT1, a second light-emission controlling signal terminal EMIT2, a first transistor T1, a second transistor T2, a third transistor T3, a fourth transistor T4, a fifth transistor T5, a diving transistor DT, an organic light-emitting diode OLED, a capacitor C, a data signal terminal DL, a first power supply voltage terminal VDD and a second power supply voltage terminal VEE.

Specifically, as shown in FIG. 2, a gate of the first transistor T1 and the first electrode of the first transistor T1 are both connected with the first scanning signal terminal S1, and the second electrode of the first transistor T1 is connected with the second electrode of the driving transistor DT.

A gate of the second transistor T2 is connected to the second scanning signal terminal S2, a first electrode of the second transistor T2 is connected with the second electrode of the driving transistor DT, and a second electrode of the second transistor T2 is connected with the gate of the driving transistor DT.

A gate of the third transistor T3 is connected with the second scanning signal terminal S2, a first electrode of the third transistor T3 is connected with the data signal terminal DL, and a second electrode of the third transistor T3 is connected with the first electrode of the driving transistor DT.

A gate of the fourth transistor T4 is connected with the first light-emission controlling signal terminal EMIT1, a first electrode of the fourth transistor T4 is connected with the first power supply voltage terminal VDD, and a second electrode of the fourth transistor T4 is connected with the first electrode of the driving transistor DT.

A gate of the fifth transistor T5 is connected to the second light-emission controlling signal terminal EMIT2, a first electrode of the fifth transistor T5 is connected to the second electrode of the driving transistor DT, and a second electrode of the fifth transistor T5 is connected with the anode of the organic light-emitting diode OLED.

A terminal of the capacitor C is connected to the first power supply voltage terminal VDD, and the other terminal of the capacitor C is connected to the gate of the driving transistor DT.

A cathode of the organic light-emitting diode OLED is connected to the second power supply voltage terminal VEE.

As can be seen from the above embodiment, unlike the organic light-emitting pixel driving circuit shown in FIG. 1, in the organic light-emitting pixel driving circuit shown in FIG. 2, the first electrode and gate of the first transistor T1 are both connected to the first scanning signal terminal S1. As such, the first scanning signal terminal S1 may further be used to receive the initialization signal and meanwhile transmit the signal to the gate of the driving transistor DT and the anode of the organic light-emitting diode OLED. That is to say, the signal transmitted on the first scanning signal terminal S1 may simultaneously serve as the initialization signal provided to the anode of the light-emitting diode as well as a control signal for controlling the first transistor T1 to turn on. The organic light-emitting pixel driving circuit of the present embodiment provides the initialization signal without need to arrange an extra signal line, saves the area of the layout occupied by the organic light-emitting pixel driving circuit, and meanwhile avoids mutual interference between signal lines when different signals are provided to the organic light-emitting pixel driving circuit through a plurality of signal lines.

It needs to be appreciated that although in the organic light-emitting pixel driving circuit shown in FIG. 1 and FIG. 2, the first transistor T1, second transistor T2, third transistor T3, fourth transistor T4, fifth transistor and the driving transistor DT each are a PMOS transistor, this is only illustrative. During practical application, the types of the transistors may be set according to needs of the application scenarios. In addition, the organic light-emitting pixel driving circuit employs the same type of transistor, these transistors in the driving circuit may be simultaneously manufactured in the same manufacturing process so that the manufacturing process of the driving circuit is simplified.

Hereunder, the working principle of the organic light-emitting pixel driving circuit shown in FIG. 1 will be described in conjunction with the time sequence shown in FIG. 3 by taking an example in which the first transistor T1, second transistor T2, third transistor T3, fourth transistor T4, fifth transistor and the driving transistor DT each are a PMOS transistor.

In a first phase P1, a low level signal is applied to the first scanning signal terminal S1 and second scanning signal terminal S2, a high level signal is applied to the first light-emission controlling signal terminal EMIT1, a low level signal is applied to the second light-emission controlling signal terminal EMIT2, a data signal Vdata is applied to the data signal terminal DL, an initialization signal Vref is applied to the initialization signal terminal VREF, the first power supply voltage terminal VDD provides a first power supply voltage signal Vdd, the second power supply voltage terminal VEE provides a second power supply voltage signal Vee, and meanwhile a value of Vee is set higher than a value of Vref. The first transistor T1 is turned on under control of the first scanning signal terminal S1, the second transistor T2 is turned on under control of the second scanning signal terminal S2, the third transistor T3 is turned on under control of the second scanning signal terminal S2, the fourth transistor T4 is turned off under control of the first light-emission controlling signal terminal EMIT1, and the fifth transistor T5 is turned on under control of the second light-emission controlling signal terminal EMIT2. Since the first transistor T1, second transistor T2 and fifth transistor T5 are turned on, the gate and second electrode of the driving transistor DT are shorted through the second transistor T2. At this time, the potential of the anode of the organic light-emitting diode OLED, the potential Vg of the gate of the driving transistor DT and the potential Vd of the second electrode of the driving transistor reach Vref. The capacitor C is charged through the first power supply voltage signal Vdd, and a differential voltage of both terminals of the capacitor C is Vdd−Vref. The potential Vs of the first electrode of the driving transistor DT reaches Vdata. Since a value of Vee is higher than that of Vref, i.e., the potential of the cathode of the organic light-emitting diode OLED is higher than the potential of the anode, whereupon the organic light-emitting diode OLED does not emit light.

In a second phase P2, a high level signal is applied to the first scanning signal terminal S1, a low level signal is applied to the second scanning signal terminal S2, a high level signal is applied to the first light-emission controlling signal terminal EMIT1, a high level signal is applied to the second light-emission controlling signal terminal EMIT2, a data signal Vdata is applied to the data signal terminal DL, and the first power supply voltage terminal provides the first power supply voltage Vdd. At this time, the second transistor T2, third transistor T3 and driving transistor DT are turned on, and the first transistor T1, fourth transistor T4 and fifth transistor T5 are turned off. At this time, since Vdata is higher than Vref, the potential of the second electrode of the driving transistor DT and the potential of the gate of the driving transistor DT gradually rise until Vdata−|Vth|, and then the driving transistor DT is turned off, wherein Vth is a threshold voltage of the driving transistor DT. In this phase, the potential of both the gate and second electrode of the driving transistor DT reaches Vdata−|Vth|, and the voltage difference between both terminals of the capacitor C is Vdd−Vdata+|Vth|.

In a third phase P3, a high level signal is applied to the first scanning signal terminal S1, a high level signal is applied to the second scanning signal terminal S2, a low level signal is applied to the first light-emission controlling signal terminal EMIT1, a low level signal is applied to the second light-emission controlling signal terminal EMIT2, the first power supply voltage terminal provides the first power supply voltage signal Vdd, and the second power supply voltage terminal VEE provides the second power supply voltage signal Vee. At this time, the fourth transistor T4, fifth transistor T5 and driving transistor DT are turned on, and the first transistor T1, second transistor T2 and third transistor T3 are turned off. In this phase, both terminals of the capacitor C are respectively connected with the gate and first electrode of the driving transistor DT. Hence, a change of voltage of the first electrode of the driving transistor DT is fed back to the gate of the driving transistor DT. That is to say, the voltage difference between both terminals of the capacitor C (namely, voltage Vgs between the gate and first electrode of the driving transistor DT) does not change, and still remains at Vdd−Vdata+|Vth|. At this time, the driving transistor DT is in a saturated state, and the electrical current flowing through the organic light-emitting diode OLED is:

$$Ioled = K(Vs - Vg - |Vth|)^2 = K(Vdd - Vdata + |Vth| - |Vth|)^2 = K(Vdd - Vdata)^2$$

Wherein, K is a constant related to process parameters and geometrical dimensions of the driving transistor DT, and Vgs is a voltage between the first electrode and gate of the driving transistor DT.

As known from the above formula, the electrical current driving the OLED to emit light is only related to the first power supply voltage Vdd and data signal Vdata, and not related to the threshold voltage Vth of the driving transistor DT. Since the capacitor C does not have a path for discharge or discharge, a charge in the capacitor C and voltages at both terminals all remain unchanged. Therefore, the electrical current flowing through the OLED remains I=K(Vdd−Vdata)$^2$, and the OLED maintains this light-emitting state. Therefore, this may improve stability of the electrical current flowing through the OLED so that luminance of the OLED is stable.

Figure 3:
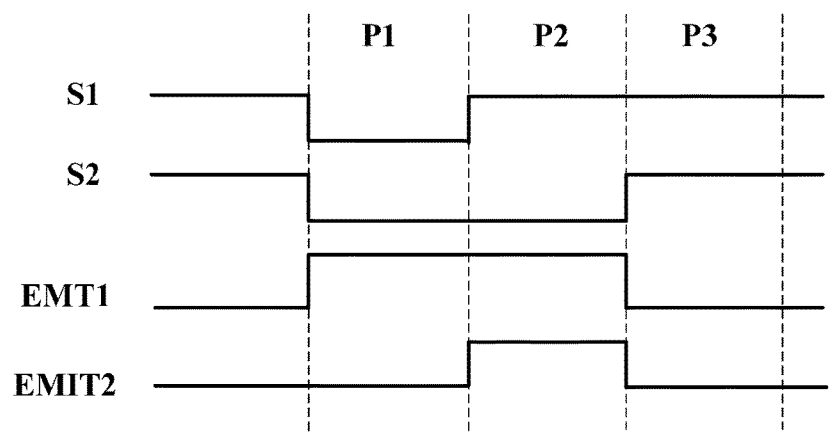
FIG. 3 is a working time-sequence diagram for driving the organic light-emitting pixel driving circuit shown in FIG. 1 or FIG. 2.

In some application scenarios, the organic light-emitting pixel driving circuit shown in FIG. 2 may also be driven using the working time sequence shown in FIG. 3. Furthermore, when it is driven with the time sequence of FIG. 3, the work procedures in phases P2-P3 are identical with the work procedure of the organic light-emitting pixel driving circuit shown in FIG. 1, and the light-emitting current finally obtained is also the same.

Unlike the work procedure of the pixel driving circuit shown in FIG. 1, when the pixel driving circuit shown in FIG. 2 is driven, in the first phase P1 a low level signal is applied to the first scanning signal terminal S1 and second scanning signal terminal S2, a high level signal is applied to the first organic light-emission controlling signal line EMIT1, a low level signal is applied to the second organic light-emission controlling signal line EMIT2, the first transistor T1, second transistor T2 and fifth transistor T5 all are turned on so that the potential of the anode of the organic light-emitting diode OLED and the potential of the gate of the driving transistor DT reach the low level signal provided by the first scanning signal terminal S1.

In the working time sequence shown in the present embodiment, as shown in FIG. 3, in a cycle, the signal applied on the second scanning signal terminal S2 and the signal applied on the first light-emission controlling signal terminal EMIT1 are anti-phase signals relative to each other. As such, an inverter may be arranged in a shift register for generating the signal on the second scanning signal terminal S2 to implement phase inversion of the second scanning signal and first light-emission controlling signal, thereby reducing the number of signal ports for generating driving signals, and reducing the area of the layout occupied by the circuit in the organic light-emitting display panel.

Figure 4:
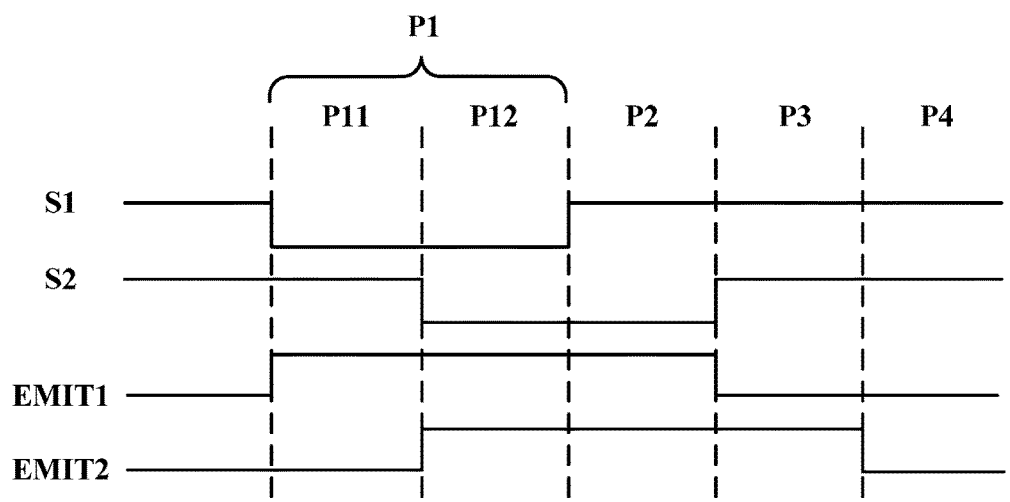
FIG. 4 is another working time-sequence diagram for driving the organic light-emitting pixel driving circuit shown in FIG. 1 or FIG. 2.

In some application scenarios, the organic light-emitting pixel driving circuit shown in FIG. 1 may also employ the time sequence shown in FIG. 4 to drive.

Specifically, the first phase P1 include two sub-phases P11 and P12.

In the first sub-phase P11, a low level signal is applied to the first scanning signal terminal S1, a high level signal is applied to the second scanning signal terminal S2, a high level signal is applied to the first light-emission controlling signal terminal EMIT1, a low level signal is applied to the second light-emission controlling signal terminal EMIT2, an initialization signal Vref is applied to the initialization signal terminal VREF, the second power supply voltage terminal VEE provides a second power supply voltage signal Vee, and meanwhile a value of Vee is set higher than a value of Vref. In this phase, the first transistor T1 and fifth transistor T5 are turned on, and the second transistor T2, third transistor T3, fourth transistor T4 and driving transistor DT are turned on. The initialization signal Vref is transmitted to the anode of the organic light-emitting diode OLED and the second electrode of the driving transistor DT through the first transistor T1 and fifth transistor T5. At this time, the potential of the anode of the organic light-emitting diode OLED and the potential Vd of the second electrode of the driving transistor DT reach Vref. Since the value of Vref is smaller than the value of Vee, the organic light-emitting diode OLED does not emit light at this time.

In the second sub-phase P12, a low level signal is applied to the first scanning signal terminal S1, a low level signal is applied to the second scanning signal terminal S2, a high level signal is applied to the first light-emission controlling signal terminal EMIT1, a high level signal is applied to the second light-emission controlling signal terminal EMIT2, a data signal Vdata is applied to the data signal terminal DL, the initialization signal Vref is applied to the initialization signal terminal VREF, and the first power supply voltage terminal VDD provides the first power supply voltage signal Vdd. In this phase, the first transistor T1, second transistor T2, third transistor T3 and driving transistor DT are turned on, and fourth transistor T4 and fifth transistor T5 are turned off. The gate and second electrode of the driving transistor DT are shorted together through the second transistor T2, and the initialization signal Vref is transmitted through the first transistor T1 and second transistor T2 to the gate of the second electrode of the driving transistor DT. At this time, the potential Vg of the gate of the driving transistor DT and the potential Vd of the second electrode of the driving transistor DT reach Vref. The capacitor C charges through the first power supply voltage signal Vdd, and a voltage difference between two terminals of the capacitor C is Vdd−Vref. The data signal Vdata is transmitted through the third transistor T3 to the first electrode of the driving transistor DT, and the potential Vs of the first electrode of the driving transistor DT reaches Vdata.

In the second phase P2, a high level signal is applied to the first scanning signal terminal S1, a low level signal is applied to the second scanning signal terminal S2, a high level signal is applied to the first light-emission controlling signal terminal EMIT1, a high level signal is applied to the second light-emission controlling signal terminal EMIT2, a data signal Vdata is applied to the data signal terminal DL, and the first power supply voltage terminal provides the first power supply voltage signal Vdd. At this time, the second transistor T2, third transistor T3 and driving transistor DT are turned on, and the first transistor T1, fourth transistor T4 and fifth transistor T5 are turned off. At this time, since Vdata is higher than Vref, the potential of the second electrode of the driving transistor DT and the potential of the gate of the driving transistor DT gradually rise from Vref of the first phase P12 until Vdata−|Vth|, and then the driving transistor DT is turned off, wherein Vth is a threshold voltage of the driving transistor DT. In this phase, the potential of both the gate and second electrode of the driving transistor DT reaches Vdata−|Vth|, and the voltage difference between both terminals of the capacitor C is Vdd−Vdata+|Vth|.

In the third phase P3, a high level signal is applied to the first scanning signal terminal S1, a high level signal is applied to the second scanning signal terminal S2, a low level signal is applied to the first light-emission controlling signal terminal EMIT1, a high level signal is applied to the second light-emission controlling signal terminal EMIT2, and the first power supply voltage terminal VDD provides the first power supply voltage signal Vdd. In this phase, the fourth transistor T4 and driving transistor DT are turned on, and the first transistor T1, second transistor T2, third transistor T3 and fifth transistor T5 are turned off. The power supply voltage signal Vdd is transmitted to the first electrode of the driving transistor DT through the fourth transistor T4. At this time, the potential Vs of the first electrode of the driving transistor DT is Vdd, and the potential Vg of the gate of the driving transistor DT remains unchanged at Vdata−|Vth| of the second phase P2. At this time, the capacitor C is connected in parallel with the first electrode and gate of the driving transistor DT, and the voltage difference of its two terminals is Vdd−Vdata+|Vth|.

In a fourth phase P4, a high level signal is applied to the first scanning signal terminal S1, a high level signal is applied to the second scanning signal terminal S2, a low level signal is applied to the first light-emission controlling signal terminal EMIT1, a low level signal is applied to the second light-emission controlling signal terminal EMIT2, the first power supply voltage terminal VDD provides the first power supply voltage signal Vdd, and the second power supply voltage terminal VEE provides the second power supply voltage signal Vee. At this time, the fourth transistor T4, fifth transistor T5 and driving transistor DT are turned on, and the first transistor T1, second transistor T2, and third transistor T3 are turned off. In this phase, both terminals of the capacitor C are respectively connected with the gate and first electrode of the driving transistor DT. Hence, a change of voltage of the first electrode of the driving transistor DT is fed back to the gate of the driving transistor DT. That is to say, the voltage difference between both terminals of the capacitor C (namely, voltage Vgs between the gate and first electrode of the driving transistor DT) does not change, and still remains at Vdd−Vdata+|Vth| in the third phase. At this time, the driving transistor DT is in a saturated state, and the electrical current flowing through the organic light-emitting diode OLED is:

$$\text{Ioled} = K(Vs - Vg - |Vth|)^2 = K(Vdd - Vdata + |Vth| - |Vth|)^2 = K(Vdd - Vdata)^2$$

Wherein, K is a constant related to process parameters and geometrical dimensions of the driving transistor DT, and Vgs is a voltage between the first electrode and gate of the driving transistor DT.

As known from the above formula, the electrical current driving the OLED to emit light is only related to the first power supply voltage Vdd and the data signal voltage Vdata, and not related to the threshold voltage Vth of the driving transistor DT. Since the capacitor C does not have a path for discharge or discharge, a charge in the capacitor C and voltages at both terminals all remain unchanged. Therefore, the electrical current flowing through the OLED remains I=K(Vdd−Vdata)$^2$, and the OLED maintains this light-emitting state. Therefore, this may improve stability of the electrical current flowing through the OLED so that luminance of the OLED is stable.

In some application scenarios, the organic light-emitting pixel driving circuit shown in FIG. 2 may also be driven using the working time sequence shown in FIG. 4. Furthermore, when it is driven with the time sequence of FIG. 4, the work procedures in phases P2-P4 are identical with the work procedure of the organic light-emitting pixel driving circuit shown in FIG. 1, and the light-emitting current finally obtained is also the same.

Unlike the work procedure of the pixel driving circuit shown in FIG. 1, when the pixel driving circuit shown in FIG. 2 is driven, in the first sub-phase P11 a low level signal is applied to the first scanning signal terminal S1 and the second light-emission controlling signal terminal EMIT2, a high level signal is applied to the second scanning signal terminal S2 and the first light-emission controlling signal terminal EMIT1. At this time, the first transistor T1 and fifth transistor T5 are turned on, and the potential of the anode of the organic light-emitting diode OLED and the potential of the second electrode of the driving transistor DT reach the low level signal on the first scanning signal terminal S1. In the second sub-phase P12, a low level signal is applied to the first scanning signal terminal S1 and the second scanning signal terminal S2, and a high level signal is applied to the first light-emission controlling signal terminal EMIT1 and second light-emission controlling signal terminal EMIT2. At this time, the first transistor T1, second transistor T2, third transistor T3 and driving transistor DT are turned on, and the gate of the driving transistor DT reaches the low level signal on the first scanning signal terminal S1. As can be seen from the working time sequence of the organic light-emitting pixel driving circuit shown in FIG. 4, unlike the working time sequence of the organic light-emitting pixel driving circuit shown in FIG. 3, in the present implementation mode the signal of the first scanning signal terminal S1 and the signal of the second scanning signal terminal S2 have the same waveform but different phase by P11; the signal of the first light-emission controlling signal terminal EMIT1 and the signal of the second light-emission controlling signal terminal also have the same waveform but different phase by P11. As such, the first light-emission controlling signal terminal EMIT1 for driving the second row of organic light-emitting diodes may be obtained by phase delaying the second light-emission controlling signal terminal EMIT2 by phase P11 in order to drive the first row of organic light-emitting diodes; the signal of the first scanning signal terminal S1 for driving the second row of organic light-emitting diodes may be obtained by delaying the signal of the second scanning signal terminal S2 for driving the first row of organic light-emitting diodes by phase P11. Therefore, on a display panel, organic light-emitting pixel driving circuits for driving adjacent rows of organic light-emitting diodes may share one scanning signal line and light-emission controlling signal line therein, thereby reducing the number of scanning signal lines and light-emission controlling signal lines on the display panel, and further reducing the area of the layout occupied by the circuit in the organic light-emitting display panel.

The present application further discloses a method of driving an organic light-emitting pixel driving circuit to drive the organic light-emitting pixel driving circuit in the above embodiments.

Figure 5:
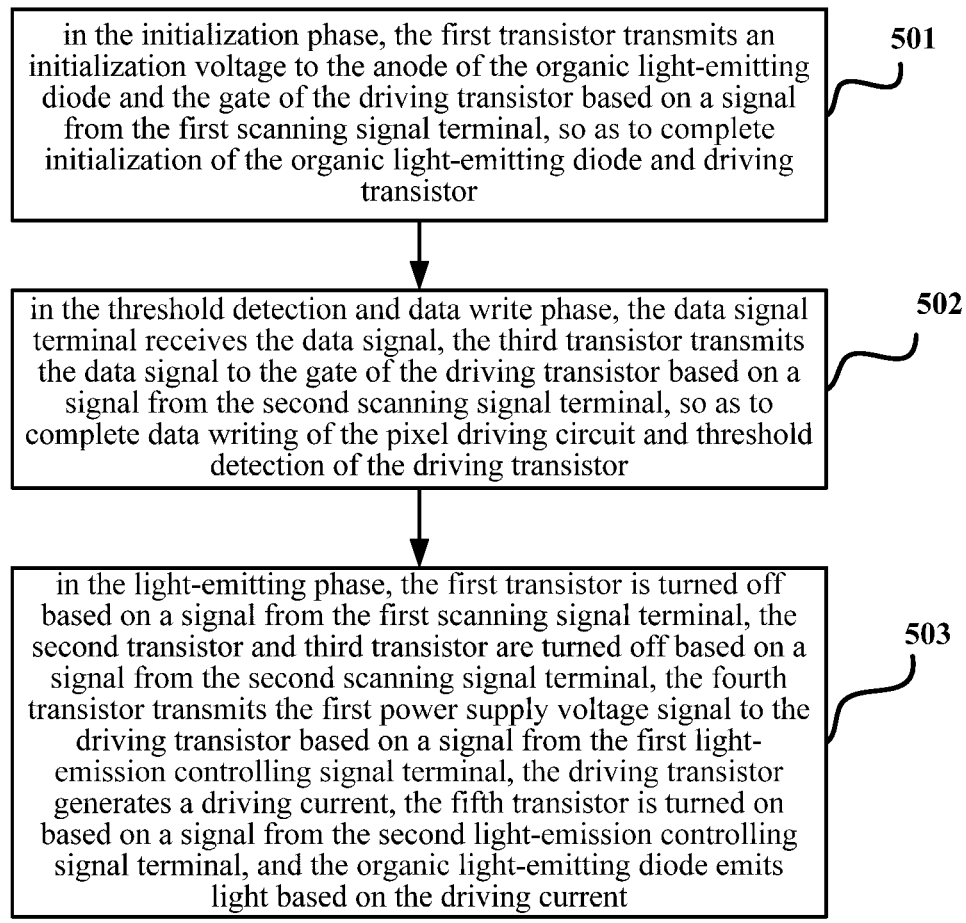
FIG. 5 is a flow chart of a driving method for driving the organic light-emitting pixel driving circuit of embodiments of the present application.

FIG. 5 is a flow chart of a driving method for driving the organic light-emitting pixel driving circuit according to the present application within a frame period.

Step 501: in the initialization phase, the first transistor transmits an initialization signal to the anode of the organic light-emitting diode and the gate of the driving transistor based on the signal of the first scanning signal terminal, and the organic light-emitting diode and driving transistor complete initialization.

Step 502: in a threshold detecting and data write phase, the data signal terminal transmits the data signal, the third transistor transmits the data signal to the gate of the driving transistor based on the signal on the second scanning signal terminal, the pixel scanning circuit completes data write and completes threshold detection of the driving transistor.

In the present embodiment, based on the gate of the driving transistor in step 501 reaching the initialization voltage, in this step, the driving transistor is turned on, the data signal is written into the first electrode of the driving transistor, and transmitted through the first electrode to the second electrode and gate of the driving transistor. At this time, when the voltage of the gate of the driving transistor gradually rises from an initial voltage until to the data signal voltage minus the threshold voltage of the driving transistor, the driving circuit completes data write, and completes detection of the threshold of the driving transistor.

Step 503: in the light-emitting phase, the first transistor is turned off based on the signal of the first scanning signal terminal, the second transistor and third transistor are turned off based on the signal of the second scanning signal terminal, the fourth transistor transmits the first power supply voltage signal to the driving transistor based on the signal of the first light-emission controlling signal terminal, the driving transistor generates a driving current, the fifth transistor is turned on based on the signal of the second light-emission controlling signal terminal, and the organic light-emitting diode emits light based on the driving current.

Herein, when the method of driving the organic light-emitting pixel driving circuit of the present embodiment is applied to the organic light-emitting pixel driving circuit shown in FIG. 1 and FIG. 2, reference may be made to FIG. 3 or FIG. 4 for the time sequence diagram of signals of step 501-step 503. Furthermore, when the driving method is used to drive the organic light-emitting pixel driving circuit including the initialization signal terminal shown in FIG. 1, in the initialization phase, the initialization signal of the anode of the organic light-emitting diode and gate of the driving transistor may be the signal transmitted on the initialization signal terminal; when the driving method is applied to the organic light-emitting pixel driving circuit shown in FIG. 2, in the initialization phase, the initialization signal of the anode of the organic light-emitting diode and gate of the driving transistor may be the signal transmitted on the first scanning signal terminal.

In some optional implementation modes of the present embodiment, when the signal time sequence shown in FIG. 4 is used to drive the organic light-emitting pixel driving circuit shown in FIG. 1 or FIG. 2, the initialization phase may further include a first initialization phase and a second initialization phase. In the first initialization phase, the first transistor, based on the signal of the first scanning signal terminal, transmits an initialization voltage to the anode of the organic light-emitting diode; in the second initialization phase, the first transistor, based on the signal of the first scanning signal terminal, and the second transistor, based on the signal of the second scanning signal terminal, transmit the initialization voltage to the gate of the driving transistor.

Figure 6:
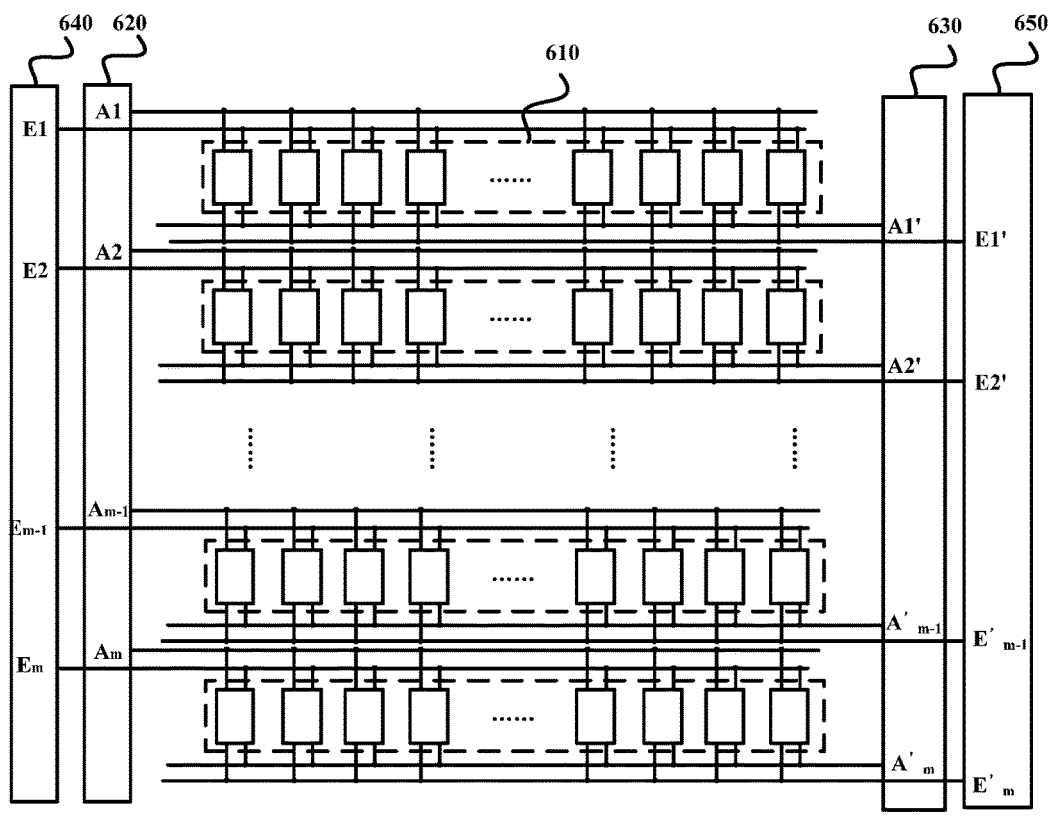
FIG. 6 is a schematic structural diagram of an embodiment of an organic light-emitting display panel according to the present application.

Reference is made to FIG. 6 which is a schematic structural diagram of an embodiment of an organic light-emitting display panel according to the present application.

The organic light-emitting display panel shown in FIG. 6 comprise multiple rows of pixel units 610, each row of pixel units 610 comprising a plurality of organic light-emitting pixel driving circuits stated in the embodiments of the present application. For example, each pixel unit in each row of pixel units 610 includes one organic light-emitting pixel driving circuit.

Each row of pixel units are connected with a first scanning signal line, a second scanning signal line, a first light-emission controlling signal line and a second light-emission controlling signal line. The first scanning signal terminal receives a signal transmitted by the first scanning signal line, and the second scanning signal terminal receives a signal transmitted by the second scanning signal line. The first light-emission controlling signal terminal receives a signal transmitted by the first light-emission controlling signal line, and the second light-emission controlling signal terminal receives a signal transmitted by the second light-emission controlling signal line. For example, in some application scenarios, the signal of the first scanning signal line A1-Am and the signal of the second scanning signal line A1'-Am' may be respectively generated by two shift registers 620, 630; the signal of the first light-emission controlling signal line E1-Em and the signal of the second light-emission controlling signal line E1'-Em' may be respectively generated by two shift registers 640, 650. In some application scenarios, the signal of the first scanning signal line A1-Am and the signal of the second scanning signal line A1'-Am' may have the same waveform as S1 and S2 in FIG. 3 or FIG. 4, wherein the signal of the first scanning signal line A1-Am may have the same waveform as S1, and the signal of the second scanning signal line A'-Am' may have the same waveform as S2. The signal of the first light-emission controlling signal line E1-Em and the signal of the second light-emission controlling signal line E1'-Em' may have the same waveform as EMIT1 and EMIT2 in FIG. 3 or FIG. 4, wherein the first light-emission controlling signal line E1-Em may have the same waveform as EMIT1, and the second light-emission controlling signal line E1'-Em' may have the same waveform as EMIT2.

As the organic light-emitting display panel according to the present embodiment employs the aforesaid organic light-emitting pixel driving circuit, the pixel circuit occupies a smaller area of the layout in the display panel, which facilitates implementation of a high-PPI display panel. In addition, since the organic light-emitting pixel driving circuit may implement compensation for the threshold of the driving transistor and improve uniformity of luminance of the organic light-emitting display panel of the present embodiment.

Figure 7:
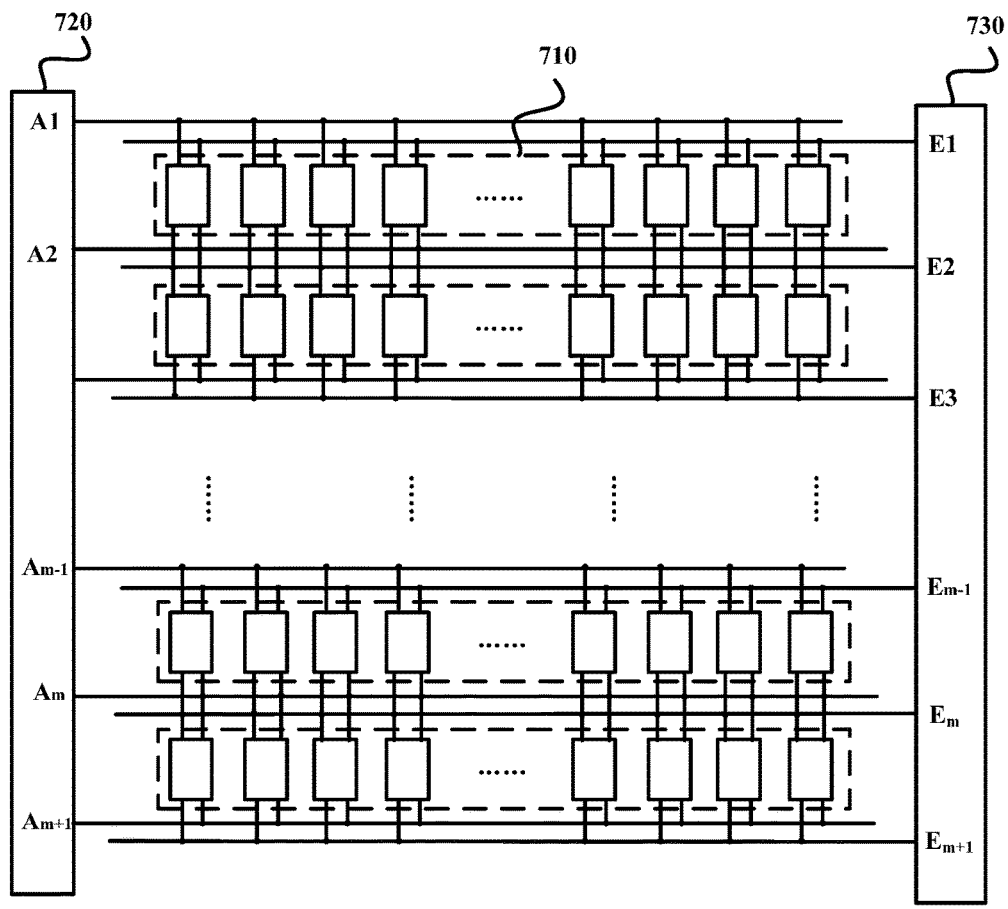
FIG. 7 is a schematic structural diagram of an organic light-emitting display panel according to another embodiment of the present application.

Referring to FIG. 7, FIG. 7 is a schematic structural diagram of an organic light-emitting display panel according to another embodiment of the present application.

Like the organic light-emitting display panel shown in FIG. 6, the organic light-emitting display panel in the present embodiment also comprise multiple rows of pixel units 710, each row of pixel units 710 comprising a plurality of organic light-emitting pixel driving circuits stated in the embodiments of the present application. For example, each pixel unit in each row of pixel units 710 includes one organic light-emitting pixel driving circuit. In addition, each row of pixel units are connected with a first scanning signal line, a second scanning signal line, a first light-emission controlling signal line and a second light-emission controlling signal line.

Different from the embodiment shown in FIG. 6, in the present embodiment, the second scanning signal line connected with the $i^{th}$ row of pixel units is multiplexed as the first scanning signal line of the $(i+1)^{th}$ row of pixel units, and the second light-emission controlling signal line connected with the $i^{th}$ row of pixel units is multiplexed as the first light-emission controlling signal line of the $(i+1)^{th}$ row of pixel units, wherein i is a positive integer.

Specifically, as shown in FIG. 7, the second scanning signal line A2 of the first row of pixels is multiplexed as the first scanning signal line of the second row of pixels, and the second light-emission controlling signal line E2 of the first row of pixels is multiplexed as the first light-emission controlling signal line of the second row of pixels. As such, the first scanning signal and second scanning signal needed by the organic light-emitting pixel driving circuits may be generated by the same shift register 720, and the first light-emission controlling signal and second light-emission controlling signal may be generated by the same shift register 730, thereby further reducing the area of the layout occupied by the circuit in the organic light-emitting display panel.

The organic light-emitting pixel driving circuits in the organic light-emitting display panel of the present embodiment for example may employ the time sequence shown in FIG. 4 to drive.

The multiplexing relationship between scanning signal lines and light-emission controlling signal lines in two adjacent rows of pixel units is illustrated below with the time sequence shown in FIG. 8.

Figure 8:
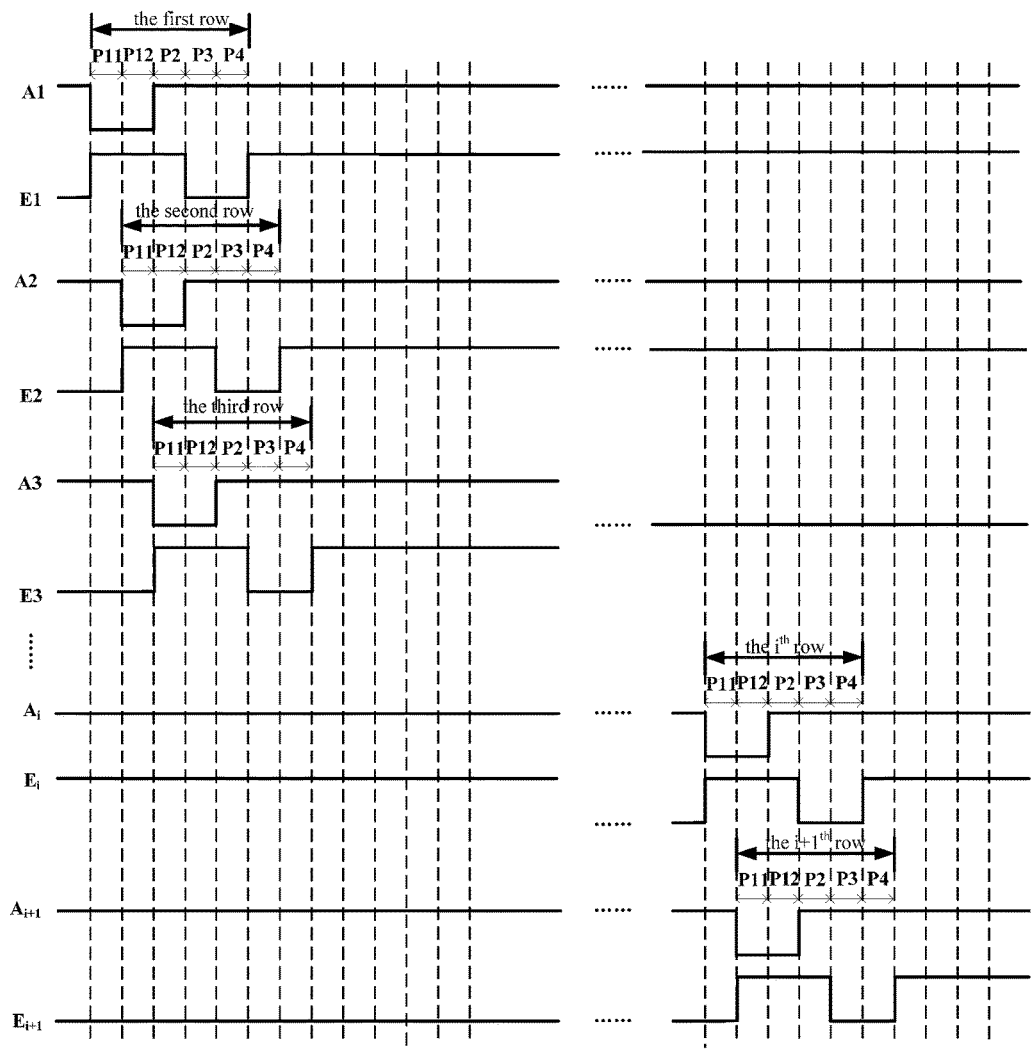
FIG. 8 is a working time-sequence diagram that may be applied to the organic light-emitting display panel shown in FIG. 7.

FIG. 8 shows a schematic time-sequence diagram of the scanning signal lines and light-emission controlling signal lines in FIG. 7. As can be seen from FIG. 8, the driving signal applied on the scanning signal line A2 is delayed one P11 phase relative to the driving signal applied on the scanning signal line A1. Therefore, the driving signal applied on the scanning signal line A1 and the driving signal applied on the scanning signal line A2 may be output by two adjacent shift register units in the shift register 720 in FIG. 7. The driving signal applied on the light-emission controlling signal line E2 is delayed one P11 phase relative to the driving signal applied on the light-emission controlling signal line E1. Therefore, the driving signal applied on the light-emission controlling signal line E1 and the driving signal applied on the light-emission controlling signal line E2 may be output by two adjacent shift register units in the shift register 730 in FIG. 7. The signal applied on the scanning signal line and the signal applied on the light-emission controlling signal line may be output by the same shift register 720 or shift register 730. Similarly, the driving signal applied on the scanning signal line Ai+1 is delayed one P11 cycle relative to the driving signal applied on the scanning signal line Ai. Therefore, the driving signal applied on the scanning signal line Ai1 and the driving signal applied on the scanning signal line Ai2 may be output by two adjacent shift register units in the shift register 720 in FIG. 7. The driving signal applied on the light-emission controlling signal line Ei+1 is delayed one P11 cycle relative to the driving signal applied on the light-emission controlling signal line Ei. Therefore, the driving signal applied on the light-emission controlling signal line Ei1 and the driving signal applied on the light-emission controlling signal line Ei2 may be output by two adjacent shift register units in the shift register 730 in FIG. 7. Here, i1 and i2 are neighboring natural numbers, $0<i\leq m$, and m is the number of rows of pixel units of the organic light-emitting display panel. In addition, in a time period (namely, a first row time period shown in FIG. 8) for driving the first row of pixels, the scanning signal line A2 acts as the second scanning signal line of the organic light-emitting pixel driving circuits in the first row of pixels; in a time period (namely, a second row time period shown in FIG. 8) for driving the second row of pixels, the scanning signal line A2 acts as the first scanning signal line of the organic light-emitting pixel driving circuits in the second row of pixels. In a time period for driving the first row of pixels, the light-emission controlling signal line E2 acts as the second light-emission controlling signal line of the organic light-emitting pixel driving circuits in the first row of pixels; in a time period for driving the second row of pixels, the light-emission controlling signal line E2 acts as the first light-emission controlling signal line of the organic light-emitting pixel driving circuits in the second row of pixels. Similarly, in a time period (namely, a $i^{th}$ row time period shown in FIG. 8) for driving the $i^{th}$ row of pixels, the scanning signal line $A_{i+1}$ acts as the second scanning signal line of the organic light-emitting pixel driving circuits in the $i^{th}$ row of pixels; in a time period (namely, a i+1$^{th}$ row time period shown in FIG. 8) for driving the $(i+1)^{th}$ row of pixels, the scanning signal line $A_{i+1}$ acts as the first scanning signal line of the organic light-emitting pixel driving circuits in the i+1th row of pixels. In a time period for driving the $i^{th}$ row of pixels, the light-emission controlling signal line $E_{i+1}$ acts as the second light-emission controlling signal line of the organic light-emitting pixel driving circuits in the $i^{th}$ row of pixels; in a time period for driving the $(i+1)^{th}$ row of pixels, the light-emission controlling signal line $E_{i+1}$ acts as the first light-emission controlling signal line of the organic light-emitting pixel driving circuits in the $(i+1)^{th}$ row of pixels.

As can be seen from the above, the first scanning signal line for driving the organic light-emitting pixel driving circuits of the i+1$^{th}$ row of pixels is multiplexed as the second scanning signal line for driving the organic light-emitting pixel driving circuits of the $i^{th}$ row of pixels, and the first light-emission controlling signal line for driving the organic light-emitting pixel driving circuits of the $(i+1)^{th}$ row of pixels is multiplexed as the second light-emission controlling signal line for driving the organic light-emitting pixel driving circuits of the $i^{th}$ row of pixels. The control signal applied on the first scanning signal line $A_{i+1}$ for driving the i+1$^{th}$ row may be obtained by delaying the driving signal applied on the second scanning signal line for driving the $i^{th}$ row by one P11 phase. The control signal applied on the first light-emission controlling signal line $E_{i+1}$ for driving the i+1$^{th}$ row may be obtained by delaying the driving signal applied on the second light-emission controlling signal line for driving the $i^{th}$ row by one P11 phase.

As known from a comparison of the organic light-emitting display panels shown in FIG. 6 and FIG. 7, if the organic light-emitting display panels shown in FIG. 6 and FIG. 7 both include m rows of pixel units, the organic light-emitting display panel shown in FIG. 6 needs 2 m scanning signal lines to drive respective rows of pixel units, whereas since the organic light-emitting pixel driving circuits for driving adjacent pixels may share one of the scanning signal lines, the organic light-emitting display panel shown in FIG. 7 only needs m+1 scanning signal lines to drive respective rows of pixel units; the organic light-emitting display panel shown in FIG. 6 needs 2 m light-emission controlling signal lines to drive respective rows of pixel units, whereas since the organic light-emitting pixel driving circuits for driving adjacent pixels may share one of the light-emission controlling signal lines, the organic light-emitting display panel shown in FIG. 7 only needs m+1 scanning signal lines to drive respective rows of pixel units, thereby reducing the area of the layout occupied by the circuit in the organic light-emitting display panel.

What have been described above are only preferred embodiments of the present application and illustrations of the employed technical principles. Those skilled in the art should understand that the invention scope related to in the present application is not limited to technical solutions formed by specific combinations of the technical features above, which should also cover other technical solutions formed by any arbitrary combination of the technical features above or their equivalent features without departing from the inventive concept. For example, technical features formed by mutual substitution of the features above with technical features with similar functions disclosed in the present application (but not limited thereto).

What is claimed is:

1. An organic light-emitting pixel driving circuit, comprising:
   a first scanning signal terminal, a second scanning signal terminal, a first light-emission controlling signal terminal, a second light-emission controlling signal terminal, a first transistor, a second transistor, a third transistor, a fourth transistor, a fifth transistor, a diving transistor, an organic light-emitting diode, a first power supply voltage terminal, and a data signal terminal and a capacitor;
   wherein the first transistor provides an initialization signal to an anode of the organic light-emitting diode and a gate of the driving transistor based on a signal from the first scanning signal terminal;
   wherein the second transistor compensates a threshold voltage of the driving transistor based on a signal from the second scanning signal terminal, a gate of the second transistor is connected with the second scanning signal terminal, a first electrode of the second transistor is connected with a second electrode of the driving transistor, and a second electrode of the second transistor is connected with the gate of the driving transistor;
   wherein the third transistor provides a data signal to the driving transistor based on a signal from the second scanning signal terminal, a gate of the third transistor is connected with the second scanning signal terminal, a first electrode of the third transistor is connected with the data signal terminal, and a second electrode of the third transistor is connected with the first electrode of the driving transistor;
   wherein the fourth transistor transmits a first power supply voltage to the driving transistor based on a signal from the first light-emission controlling signal terminal;
   wherein the fifth transistor is coupled in series between the driving transistor and the anode of the organic light-emitting diode, and controls electrical connection between the driving transistor and the organic light-emitting diode based on a signal from the second light-emission controlling signal terminal, a gate of the fifth transistor is connected with the second light-emission controlling signal terminal, a first electrode of the fifth transistor is connected with the second electrode of the driving transistor, and a second electrode of the fifth transistor is connected with the anode of the organic light emitting diode;

wherein the capacitor is connected to the first power supply voltage terminal, and configured to store the data signal transmitted to the driving transistor; and wherein the organic light-emitting diode is configured to emit light in response to a driving current generated by the driving transistor.

2. The organic light-emitting pixel driving circuit according to claim 1, wherein the first transistor and second transistor are dual-gate transistors.

3. The organic light-emitting pixel driving circuit according to claim 1, further comprising an initialization signal terminal, wherein a gate of the first transistor is connected with the first scanning signal terminal, a first electrode of the first transistor is connected with the initialization signal terminal, and a second electrode of the first transistor is connected with the second electrode of the driving transistor, and a width-length ratio of electrically conductive channels of the first transistor and second transistor is smaller than a width-length ratio of electrically conductive channels of the third transistor, fourth transistor and fifth transistor.

4. The organic light-emitting pixel driving circuit according to claim 1, wherein the initialization signal is a signal received by the first scanning signal terminal.

5. The organic light-emitting pixel driving circuit according to claim 4, further comprising a second power supply voltage terminal;

wherein a gate of the first transistor and a first electrode of the first transistor are both connected with the first scanning signal terminal, and a second electrode of the first transistor is connected with a second electrode of the driving transistor;

wherein a gate of the second transistor is connected with the second scanning signal terminal, a first electrode of the second transistor is connected with a second electrode of the driving transistor, and a second electrode of the second transistor is connected with the gate of the driving transistor;

wherein a gate of the third transistor is connected with the second scanning signal terminal, a first electrode of the third transistor is connected with the data signal terminal, and a second electrode of the third transistor is connected with the first electrode of the driving transistor;

wherein a gate of the fourth transistor is connected with the first light-emission controlling signal terminal, a first electrode of the fourth transistor is connected with the first power supply voltage terminal, and a second electrode of the fourth transistor is connected with the first electrode of the driving transistor;

wherein a gate of the fifth transistor is connected with the second light-emission controlling signal terminal, a first electrode of the fifth transistor is connected with the second electrode of the driving transistor, and a second electrode of the fifth transistor is connected with the anode of the organic light-emitting diode;

wherein a terminal of the capacitor is connected to the first power supply voltage terminal, and another terminal of the capacitor is connected to the gate of the driving transistor; and wherein a cathode of the organic light-emitting diode is connected to the second power supply voltage terminal.

6. The organic light-emitting pixel driving circuit according to claim 1, further comprising an initialization signal terminal, wherein the initialization signal is a signal transmitted from the initialization signal terminal.

7. The organic light-emitting pixel driving circuit according to claim 6, further comprising a data signal terminal, a first power supply voltage terminal and a second power supply voltage terminal;

wherein a gate of the first transistor is connected with the first scanning signal terminal, a first electrode of the first transistor is connected with the initialization signal terminal, and a second electrode of the first transistor is connected with a second electrode of the driving transistor;

wherein a gate of the second transistor is connected with the second scanning signal terminal, a first electrode of the second transistor is connected with the second electrode of the driving transistor, and a second electrode of the second transistor is connected with the gate of the driving transistor;

wherein a gate of the third transistor is connected with the second scanning signal terminal, a first electrode of the third transistor is connected with the data signal terminal, and a second electrode of the third transistor is connected with the first electrode of the driving transistor;

wherein a gate of the fourth transistor is connected with the first light-emission controlling signal terminal, a first electrode of the fourth transistor is connected with the first power supply voltage terminal, and a second electrode of the fourth transistor is connected with the first electrode of the driving transistor;

wherein a gate of the fifth transistor is connected to the second light-emission controlling signal terminal, a first electrode of the fifth transistor is connected to the second electrode of the driving transistor, and a second electrode of the fifth transistor is connected with the anode of the organic light-emitting diode;

wherein a terminal of the capacitor is connected to the first power supply voltage terminal, and another terminal of the capacitor is connected to the gate of the driving transistor; and wherein a cathode of the organic light-emitting diode is connected to the second power supply voltage terminal.

8. An organic light-emitting display panel comprising multiple rows of pixel units, each row of the pixel units comprising a plurality of the organic light-emitting pixel driving circuits according to claim 1.

9. The organic light-emitting display panel according to claim 8, wherein each row of the pixel units are connected with a first scanning signal line and a second scanning signal line;

wherein the first scanning signal terminal receives a signal transmitted from the first scanning signal line, and the second scanning signal terminal receives a signal transmitted from the second scanning signal line.

10. The organic light-emitting display panel according to claim 9, wherein the second scanning signal line connected with an $i^{th}$ row of pixel units is multiplexed as the first scanning signal line for an $(i+1)^{th}$ row of pixel units, i being a positive integer.

11. The organic light-emitting display panel according to claim 8, wherein each row of the pixel units are connected with a first light-emission controlling signal line and a second light-emission controlling signal line;

wherein the first light-emission controlling signal terminal receives a signal transmitted from the first light-emission controlling signal line, and the second light-emission controlling signal terminal receives a signal transmitted from the second light-emission controlling signal line.

12. The organic light-emitting display panel according to claim 11, wherein the second light-emission controlling signal line connected with an $i^{th}$ row of pixel units is multiplexed as the second light-emission controlling signal line for an $(i+1)^{th}$ row of pixel units, i being a positive integer.

13. A method of driving an organic light-emitting pixel driving circuit, wherein the organic light-emitting pixel driving circuit comprises:
- a first scanning signal terminal, a second scanning signal terminal, a first light-emission controlling signal terminal, a second light-emission controlling signal terminal, a first transistor, a second transistor, a third transistor, a fourth transistor, a fifth transistor, a diving transistor, an organic light-emitting diode, a first power supply voltage terminal, a data signal terminal and a capacitor;
- wherein the first transistor provides an initialization signal to an anode of the organic light-emitting diode and a gate of the driving transistor based on a signal from the first scanning signal terminal;
- wherein the second transistor compensates a threshold voltage of the driving transistor based on a signal from the second scanning signal terminal, a gate of the second transistor is connected with the second scanning signal terminal, a first electrode of the second transistor is connected with a second electrode of the driving transistor, and a second electrode of the second transistor is connected with the gate of the driving transistor;
- wherein the third transistor provides a data signal to the driving transistor based on a signal from the second scanning signal terminal, a gate of the third transistor is connected with the second scanning signal terminal, a first electrode of the third transistor is connected with the data signal terminal, and a second electrode of the third transistor is connected with the first electrode of the driving transistor;
- wherein the fourth transistor transmits a first power supply voltage to the driving transistor based on a signal from the first light-emission controlling signal terminal;
- wherein the fifth transistor is coupled in series between the driving transistor and the anode of the organic light-emitting diode, and controls electrical connection between the driving transistor and the organic light-emitting diode based on a signal from the second light-emission controlling signal terminal, a gate of the fifth transistor is connected with the second light-emission controlling signal terminal, a first electrode of the fifth transistor is connected with the second electrode of the driving transistor, and a second electrode of the fifth transistor is connected with the anode of the organic light emitting diode;
- wherein the capacitor is connected to the first power supply voltage terminal, and configured to store the data signal transmitted to the driving transistor; and
- wherein the organic light-emitting diode is configured to emit light in response to a driving current generated by the driving transistor;
- wherein the method comprises an initialization phase, a threshold detection and data write phase, and a light-emitting phase;
- wherein in the initialization phase, the first transistor transmits an initialization voltage to the anode of the organic light-emitting diode and the gate of the driving transistor based on a signal from the first scanning signal terminal, so as to complete initialization of the organic light-emitting diode and driving transistor;
- wherein in the threshold detection and data write phase, the data signal terminal receives the data signal, the third transistor transmits the data signal to the gate of the driving transistor based on a signal from the second scanning signal terminal, so as to complete data writing of the pixel driving circuit and threshold detection of the driving transistor; and
- wherein in the light-emitting phase, the first transistor is turned off based on a signal from the first scanning signal terminal, the second transistor and third transistor are turned off based on a signal from the second scanning signal terminal, the fourth transistor transmits the first power supply voltage signal to the driving transistor based on a signal from the first light-emission controlling signal terminal, the driving transistor generates a driving current, the fifth transistor is turned on based on a signal from the second light-emission controlling signal terminal, and the organic light-emitting diode emits light based on the driving current.

14. The method according to claim 13, wherein the initialization voltage is a voltage received by the first scanning signal terminal.

15. The method according to claim 13, wherein the organic light-emitting pixel driving circuit further comprises an initialization signal terminal, and the initialization voltage is a voltage signal transmitted from the initialization signal terminal.

16. The method according to claim 13, wherein the initialization phase comprises a first initialization phase and a second initialization phase;
- wherein in the first initialization phase, the first transistor transmits an initialization voltage to the anode of the organic light-emitting diode based on a signal from the first scanning signal terminal; and
- wherein in the second initialization phase, the first transistor, based on a signal from the first scanning signal terminal, and the second transistor, based on a signal from the second scanning signal terminal, transmit the initialization voltage to the gate of the driving transistor.

* * * * *